(12) United States Patent
Knörr

(10) Patent No.: US 11,652,331 B2
(45) Date of Patent: May 16, 2023

(54) METHOD FOR PRODUCING A HOUSING COVER FOR A LASER COMPONENT AND HOUSING COVER FOR A LASER COMPONENT AND LASER COMPONENT

(71) Applicant: OSRAM OLED GmbH, Regensburg (DE)

(72) Inventor: Matthias Knörr, Roßtal (DE)

(*) Notice: Subject to any disclaimer, the term of this patent is extended or adjusted under 35 U.S.C. 154(b) by 138 days.

(21) Appl. No.: 16/962,391

(22) PCT Filed: Jan. 16, 2019

(86) PCT No.: PCT/EP2019/051060
§ 371 (c)(1),
(2) Date: Jul. 15, 2020

(87) PCT Pub. No.: WO2019/141733
PCT Pub. Date: Jul. 25, 2019

(65) Prior Publication Data
US 2021/0066884 A1     Mar. 4, 2021

(30) Foreign Application Priority Data
Jan. 19, 2018  (DE) .......................... 102018101198.9

(51) Int. Cl.
*H01S 5/022*      (2021.01)
*H01S 5/02257*    (2021.01)
(Continued)

(52) U.S. Cl.
CPC ........ *H01S 5/02257* (2021.01); *H01S 5/0222* (2013.01); *H01S 5/02216* (2013.01)

(58) Field of Classification Search
CPC ............... H01S 5/02216; H01S 5/0222; H01S 5/02257
See application file for complete search history.

(56) References Cited

U.S. PATENT DOCUMENTS

| | | |
|---|---|---|
| 3,994,430 A | 11/1976 | Cusano et al. |
| 5,418,002 A | 5/1995 | Paik et al. |

(Continued)

FOREIGN PATENT DOCUMENTS

| | | |
|---|---|---|
| DE | 2319854 A1 | 10/1973 |
| DE | 4433521 A1 | 3/1995 |

(Continued)

OTHER PUBLICATIONS

Hsing, "Better Thermal Management And Smaller Footprint In Thin Film, Thick Film Design", DPC Substrate, Accessed Feb. 5, 2018, 2 pages.

(Continued)

*Primary Examiner* — Michael Carter
(74) *Attorney, Agent, or Firm* — MH2 Technology Law Group, LLP

(57) ABSTRACT

A method for producing a housing cover for a laser component, a housing for a laser component, and a laser component are provided. The method includes providing an at least partially radiation-permeable window including an aluminum oxide, provide a copper carrier for the window, and forming a copper oxide in an oxide region on the copper carrier. The method further includes arranging the window at the oxide region, forming a eutectic bond between the window and the copper oxide in the oxide region, and thereby fixing the window to the copper carrier.

15 Claims, 5 Drawing Sheets

Figure 1:
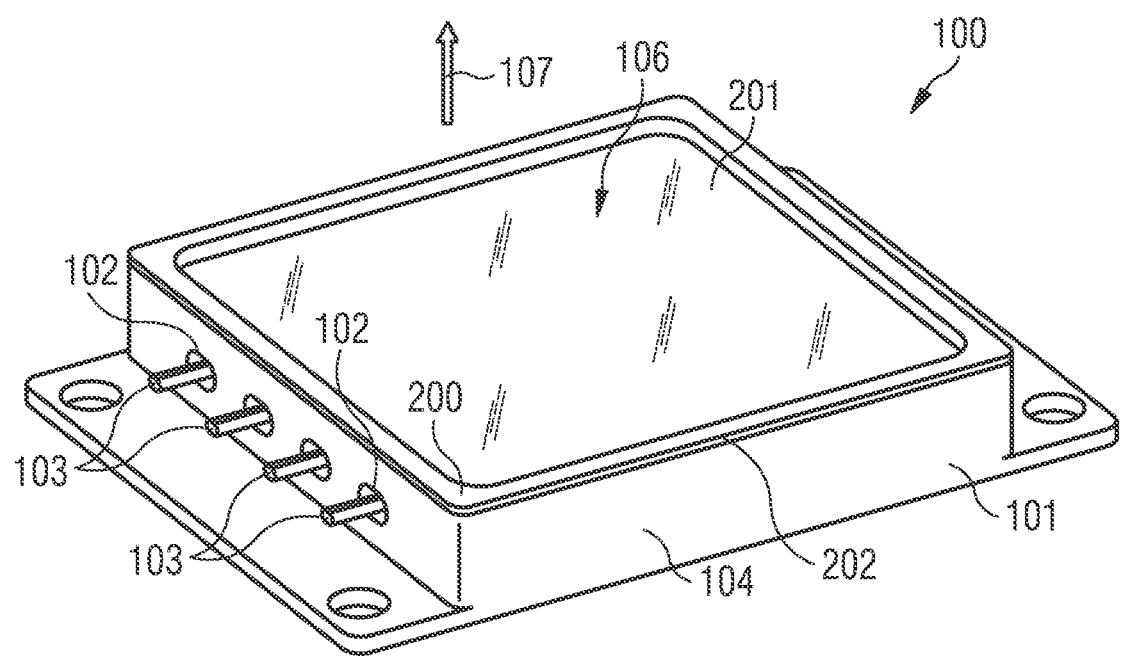

(51) Int. Cl.
H01S 5/02216 (2021.01)
H01S 5/0222 (2021.01)

(56) References Cited

U.S. PATENT DOCUMENTS

| | | | |
|---|---|---|---|
| 2006/0281202 A1* | 12/2006 | Ishida | H01S 5/02212 438/21 |
| 2008/0190542 A1* | 8/2008 | Tuan | H05K 3/385 156/60 |
| 2011/0280025 A1 | 11/2011 | Schwarz et al. | |
| 2015/0055667 A1 | 2/2015 | Horn et al. | |

FOREIGN PATENT DOCUMENTS

| | | |
|---|---|---|
| DE | 69013124 T2 | 5/1995 |
| DE | 102012103257 A1 | 10/2013 |
| EP | 1633025 A2 | 3/2006 |
| EP | 3331110 A1 | 6/2018 |
| JP | S49017381 A | 7/1974 |
| JP | S52037914 A | 3/1977 |
| JP | H05504933 A | 7/1993 |
| JP | H10135592 A | 5/1998 |
| JP | 2006073776 A | 3/2006 |
| JP | 2006344727 A | 12/2006 |
| JP | 2013041924 A | 2/2013 |
| JP | 2016066798 A | 4/2016 |
| WO | 2016180851 A1 | 11/2016 |

OTHER PUBLICATIONS

Unknown, "Sapphire", Wikipedia, <https://en.wikipedia.org/w/index.php?title=Sapphire&oldid=818522253>, accessed Oct. 30, 2018, 14 pages.

Japanese Notice of Reasons for Rejection (with English Translation) in Japanese Application No. 2020-536888 dated Oct. 25, 2022, 7 pages.

* cited by examiner

METHOD FOR PRODUCING A HOUSING COVER FOR A LASER COMPONENT AND HOUSING COVER FOR A LASER COMPONENT AND LASER COMPONENT

CROSS-REFERENCE TO RELATED APPLICATIONS

This patent application is a national stage entry from International Application No. PCT/EP2019/051060, filed on Jan. 16, 2019, published as International Publication No. WO 2019/141733 A1 on Jul. 25, 2019, and claims priority under 35 U.S.C. § 119 from German patent application 10 2018 101 198.9, filed Jan. 19, 2018, the entire contents of all of which are incorporated herein by reference.

This patent application claims the priority of the German patent application 10 2018 101 198.9, the disclosure content of which is hereby incorporated by reference.

The application concerns a method for manufacturing a housing cover for a laser component, in particular for a hermetically sealed housing. Furthermore, the application concerns a method for producing a laser component with such a housing cover. The application also concerns a housing cover for a laser component, which is produced in particular by the described method for production. The application also relates to a laser component with such a housing cover.

A method for producing a housing cover for a laser component comprises, according to at least one embodiment, providing an at least partially radiation-permeable window. The window comprises an aluminum oxide. In the ready-for-use state, radiation emitted by a laser source of the laser component can exit the laser component through the window. The window is particularly transparent to the radiation generated by the laser source. The window is for example a glass window. According to other embodiments, the window is made of a different material, for example, a plastic. According to further exemplary embodiments, the window is made of sapphire. A mixture of different materials is also possible, for example stacked on top of each other. At least one element of the window comprises aluminum oxide, especially Al2O3. According to at least one embodiment, the window consists of aluminum oxide. According to other embodiments, the window comprises aluminum oxide and additionally other materials.

According to at least one embodiment, a copper carrier is provided for the window. The copper carrier is designed to hold and fix the window. The copper carrier is also designed to be connected to a housing body that is also made of copper or another metal, for example. The copper carrier is designed to transmit radiation through the copper carrier that is emitted by the laser source during operation. For example, recesses are made in the otherwise flat copper carrier. The copper carrier consists mainly of copper or comprises copper and other materials.

According to at least one embodiment, a copper oxide is formed in an oxide region on the copper carrier. In particular, the copper oxide is formed on a surface of the copper carrier where the window is subsequently arranged. For example, the copper oxide is produced by heating the copper carrier in air. For example, not the entire surface of the copper carrier is coated with the copper oxide. Only a part of the surface, which is specified as the oxide region, is coated with copper oxide. The oxide region is especially intended where a connection is to be formed between the copper carrier and the window.

According to at least one embodiment, the window is arranged at the oxide region. For example, the window is placed on the copper carrier in such a way that the window is in contact with the oxide region.

According to at least one embodiment, a eutectic bond is formed between the window and the copper oxide in the oxide region. The copper oxide, which is a eutectic, has a lower melting point than pure copper and the aluminum oxide. For example, the copper carrier with the copper oxide is heated above the melting temperature of the copper oxide. The copper carrier and the copper oxide are heated only to such an extent that only the copper oxide becomes liquid and the aluminum oxide and the pure copper of the copper carrier remain solid. For example, the copper carrier with the copper oxide is heated to a temperature above 1000° C., especially above 1060° C. and below 1080° C.

The liquid copper oxide wets the aluminum oxide and forms, for example, a copper aluminum, especially CuAl2O4 or CuAlO2. After cooling, the copper aluminum crystallizes and forms a good bond both to the copper of the copper carrier and to the aluminum of the aluminum oxide. Thus the window is fixed to the copper carrier. The eutectic bond is in particular a hermetically sealed connection and fixation of the window to the copper carrier. Hermetically sealed in this context means in particular that dirt, such as dust and liquids, and/or gas can only penetrate the connection between the window and the copper carrier in negligible proportions or not at all.

According to at least one embodiment, a method for producing the housing cover for a laser component comprises providing the at least partially radiation-permeable window comprising the aluminum oxide. The copper carrier for the window is provided. The copper oxide is formed in an oxide region on the copper carrier. The window is positioned in the oxide region. The eutectic bond is formed between the window and the copper oxide in the oxide region. This fixes the window to the copper carrier.

Particularly if one or more semiconductor laser diodes, also called laser chips, are used as laser source, they should be arranged in a hermetically sealed housing. Otherwise, carbon contamination of the laser facet, for example, can lead to rapid failure of the laser chip. A window is provided so that the laser radiation can leave the housing. The window is part of the housing cover, which is used to seal the housing after the semiconductor chips have been mounted in the housing.

Particularly with large housing covers, connecting the window to the carrier by means of welding, soldering or other conventional connection methods leads to failures because the connection is not sufficiently tight over a sufficiently long lifetime. For example, different expansions of the window and the carrier occur during operation due to temperature changes. Conventionally, these can cause the connection between the window and the carrier to break. For example, the window is conventionally coated with a precious metal and then soldered to a metal carrier. Flaws in the cohesion and/or adhesion of the soldered joint can lead to a leaky connection. Particularly with comparatively large dimensions of the housing, high mechanical stresses can occur during operation due to the different thermal expansion coefficients. This can lead to component failures.

The method described herein now makes use of the idea that instead of soldering, a so-called Direct Bonded Copper connection (for example: directly connected copper) is used to connect the window and the carrier with each other. The bonding process is based on eutectic bonding between the aluminum oxide and the copper oxide. In those embodiments where the window is a sapphire window, no additional coating on the window is required. The eutectic bond can be formed directly between the sapphire and the copper oxide. In the exemplary embodiments where the window is a glass, an aluminum oxide cover on the glass is necessary.

Thus, cheaper materials than precious metals can be used. A stable, durable and tight connection between the window and the copper carrier can be realized, particularly a strong adhesion and cohesion. In particular, it is possible to dispense with preparatory steps that would be necessary for soldering and/or welding. Even large-area connections between the window and the copper carrier can be realized.

According to at least one embodiment, the window has a sapphire window. For example, the window consists of the sapphire window. The sapphire window is placed directly on the oxide region so that the sapphire window and the copper oxide have a common contact surface. The eutectic bond is formed directly between the sapphire window and the copper oxide. Therefore, no further coating processes or similar are necessary to form the eutectic bond between the window and the copper oxide.

According to at least one embodiment, the copper oxide is formed flat on one surface of the copper carrier. The eutectic bond is formed on the entire contact surface between the sapphire window and the surface of the copper carrier. Thus a large-area connection between the window and the copper carrier can be realized. The entire contact region of the sapphire window and the copper carrier with the copper oxide is used to fix the window to the copper carrier.

According to at least one embodiment, a coating is formed on one surface of the sapphire window. The eutectic bond is formed on the surface of the sapphire window outside the coating. Alternatively or additionally, the coating is formed on the copper carrier and the oxide region is outside the coating. By means of the coating it is therefore possible to define areas where the eutectic bond is not formed. The coating lies between the sapphire window and, for example, the copper oxide, so that the copper oxide and the sapphire cannot form a common bond in this region.

According to at least one embodiment, an aluminum oxide layer is applied to a predetermined region of the window. The region corresponds in particular to the oxide region. The eutectic bond is formed between the aluminum oxide layer and the copper oxide. This makes it possible in particular to use a window which is itself not ceramic and in particular does not contain aluminum oxide. For example, a glass window is coated with the aluminum oxide layer. The window is coated with the aluminum oxide layer in the region, so that the aluminum oxide layer is subsequently arranged on the plastic support where the copper oxide is formed.

According to at least one embodiment, the aluminum oxide layer is applied to the specified region of the window in such a way that the window remains free of aluminum oxide outside the specified region. The window is fixed to the copper carrier in such a way that the window and the copper carrier have a distance from each other outside the specified region. This allows the window to be fixed to the copper carrier in certain regions. The distance between the copper carrier and the window outside the fixation allows for example a slight relative movement between the window and the copper carrier.

According to at least one embodiment, copper oxide is formed flat on the surface of the copper carrier. The aluminum oxide layer is applied to the entire surface of the window. The eutectic bond is formed on the entire contact surface between the window and the surface of the copper carrier. This ensures the largest possible connection area between the window and the copper carrier. The connection between the window and the copper carrier is thus stable.

According to at least one embodiment, the aluminum oxide layer is applied to the window by means of vapour deposition. For example, a chemical vapor deposition and/or a physical vapor deposition is used. Other methods of applying the aluminum oxide to the window are also possible.

According to at least one embodiment, a method for producing a laser component comprises providing a housing cover, which is manufactured in particular by means of a method described herein according to at least one embodiment.

According to at least one embodiment, a housing body is provided. The housing body is designed in particular to support the laser source and to provide electrical connections between the laser source and the environment.

According to at least one embodiment, a semiconductor laser diode is arranged in the housing body. The semiconductor laser diode comprises in particular one or more semiconductor laser chips.

According to at least one embodiment, the housing body is sealed with the housing cover on a beam exit side of the laser component. The housing body is sealed by the housing cover on the beam exit side where the radiation of the semiconductor laser diode is emitted during operation. For example, the housing cover and the housing body are soldered and/or welded together. Other joining methods are also possible. In particular, the housing cover is as transparent as possible for the radiation emitted by the semiconductor laser diode during operation. This makes it possible to realize a hermetically sealed housing of the laser component, which enables the emission of the laser radiation emitted by the semiconductor laser diode inside the housing.

According to at least one embodiment, a housing cover for a laser component comprises an at least partially radiation-permeable window. The radiation-permeable window comprises an aluminum oxide. The radiation-permeable window is particularly transparent to radiation emitted by a laser source of the laser component during operation. The radiation-permeable window is made of aluminum oxide in particular or contains aluminum oxide and other materials.

According to at least one embodiment, the housing cover comprises a copper carrier which comprises a copper oxide in an oxide region. The copper carrier serves to support and hold the window. The copper oxide is at least partially formed on a surface of the copper carrier.

The housing cover comprises a eutectic bond between the window and the copper oxide in the oxide region. The eutectic bond fixes the window to the copper carrier.

According to at least one embodiment, a housing cover for a laser component comprises the at least partially radiation-permeable window which comprises the aluminum oxide. The housing cover comprises the copper carrier, which comprises the copper oxide in the oxide region. The housing cover comprises the eutectic bond which fixes the window to the copper carrier. The eutectic bond is formed between the window and the copper oxide in the oxide region.

The eutectic bond for fixing the window to the copper carrier enables a cost-effective and at the same time sufficiently stable and hermetically sealed connection of the window to the copper carrier. Thus a low-cost, stable and sufficiently hermetically sealed housing cover for a laser component is realized.

The housing cover is manufactured in particular by a method described herein.

Features, advantages and further developments of the method also apply to the housing cover and vice versa.

According to at least one embodiment, the window comprises a sapphire window. The eutectic bond is formed directly between the sapphire window and the copper oxide. The sapphire window, which consists of or at least contains aluminum oxide, is directly connected to the copper carrier. In particular, it is possible to dispense with intermediate layers between the window and the copper carrier.

According to at least one embodiment, the sapphire window comprises a coating on a surface facing the copper carrier. According to other exemplary embodiments, the coating is formed on a surface of the copper carrier facing the sapphire window. The eutectic bond is formed outside the coating. The coating enables a region where no rigid connection is formed between the sapphire window and the copper carrier.

According to at least one embodiment, the window comprises an aluminum oxide layer in a predetermined region. The region corresponds to the oxide region. The eutectic bond is formed between the aluminum oxide layer and the copper oxide. This makes it possible, in particular, to use a window which does not itself have any aluminum oxide. For example, the window is formed from a glass. The window is provided with the aluminum oxide layer in the region to be connected to the copper carrier. Correspondingly, the carrier is provided with the copper oxide in the oxide region. The oxide region and the region correspond so that the aluminum oxide layer and the copper oxide layer are in contact with each other and the eutectic bond is formed.

According to at least one embodiment, the window outside the eutectic bond is spaced from the copper carrier and has a distance from the copper carrier. The copper carrier and the window are rigidly connected to each other in regions and are spaced apart in regions and thus not rigidly connected to each other.

According to at least one embodiment, a laser component comprises a housing cover according to at least one embodiment.

According to at least one embodiment, the laser component has a housing body. The housing body is in particular made of a metal, for example copper.

The laser component has a semiconductor laser diode according to one embodiment. The semiconductor laser diode comprises in particular one or more semiconductor laser chips.

According to at least one embodiment the laser diode is arranged in the housing body. The housing body is sealed with the housing cover on one beam exit side of the laser component. Thus, a hermetically sealed housing is formed by the housing body and the housing cover, in which the semiconductor laser diode is protected from harmful conditions such as dirt and gases. In particular, a predetermined atmosphere is formed within the housing.

Further advantages, features and further developments are given in the following examples, which are explained in connection with the figures.

Identical, similar or similarly acting elements can be provided with the same reference signs in the figures. In particular, the figures and the proportions of the elements represented in the figures are not to be regarded as true to scale.

Figure 2:
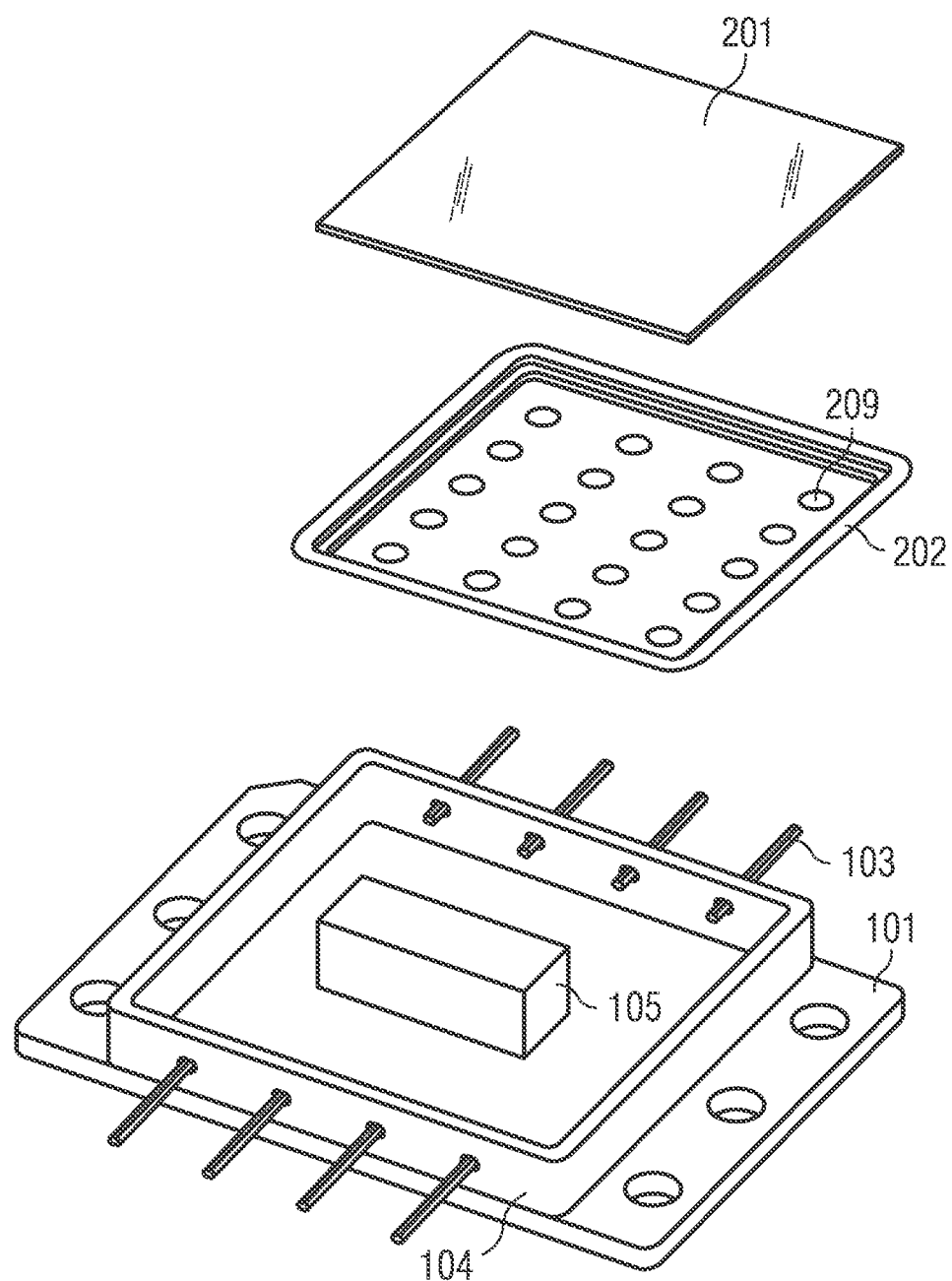
Figure 3:
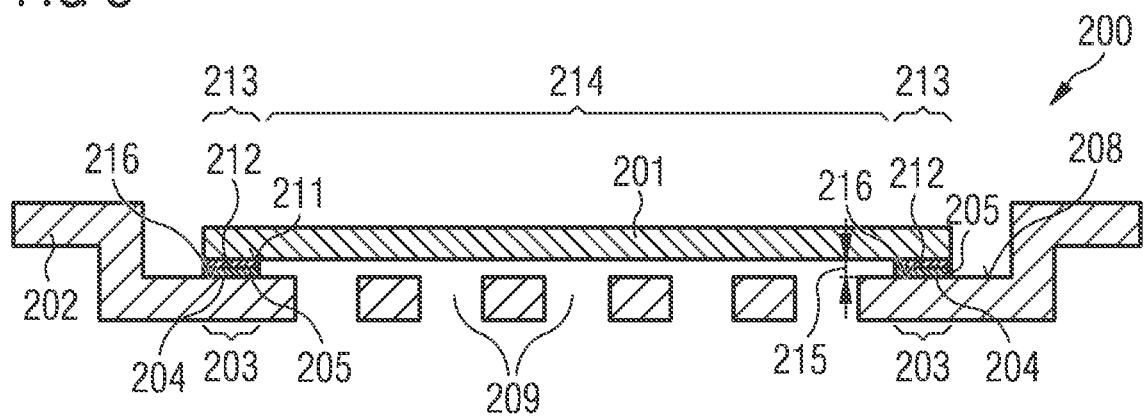
Figure 4:
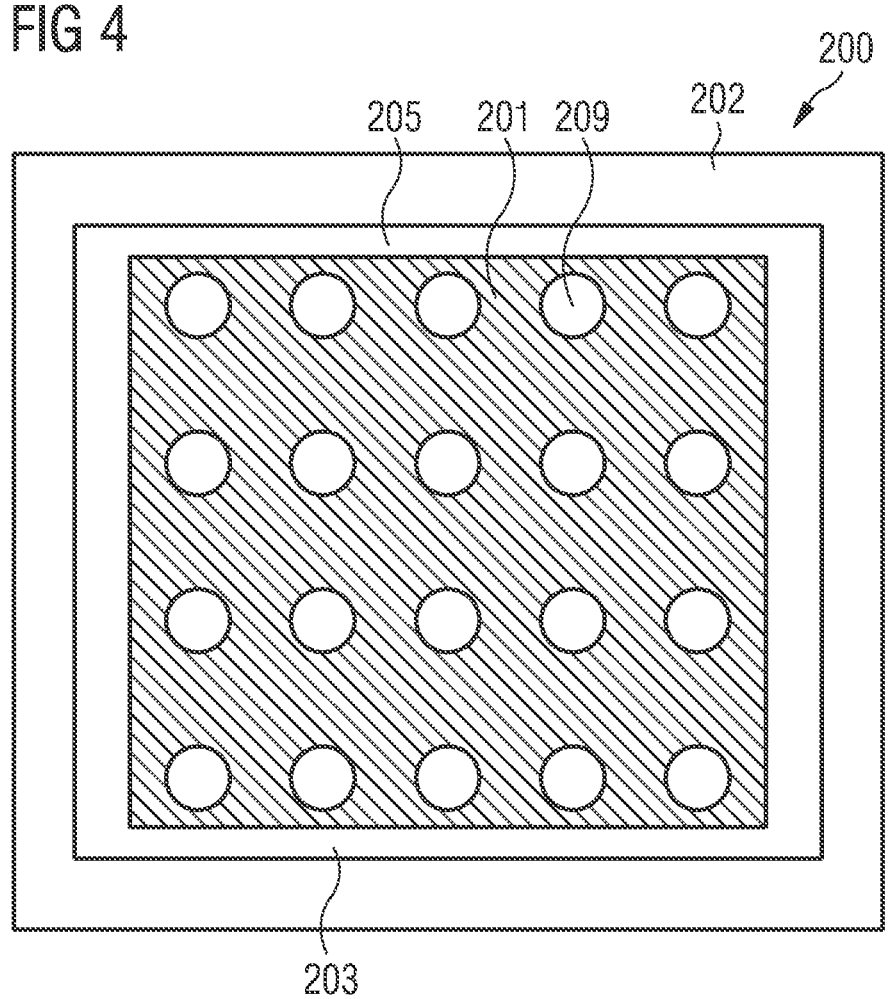
Figure 5:
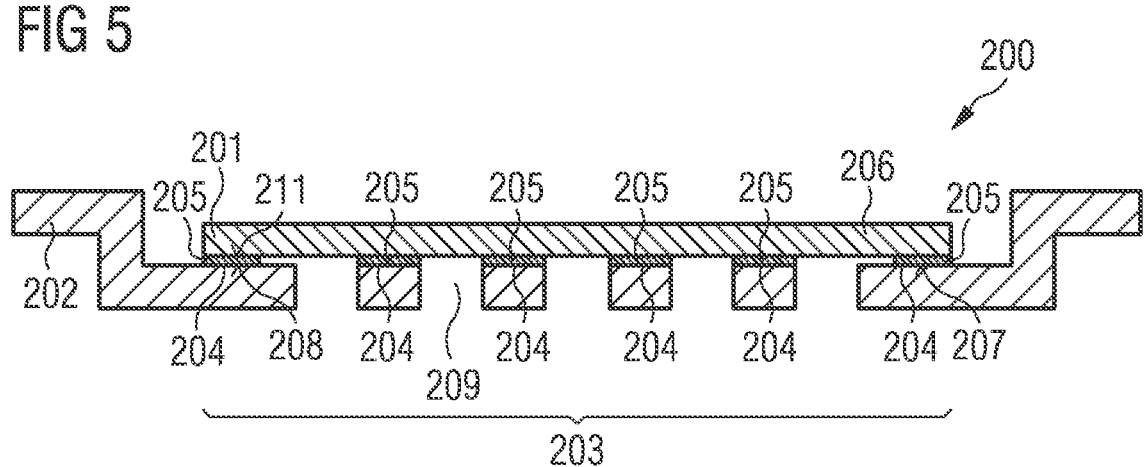
Figure 6:
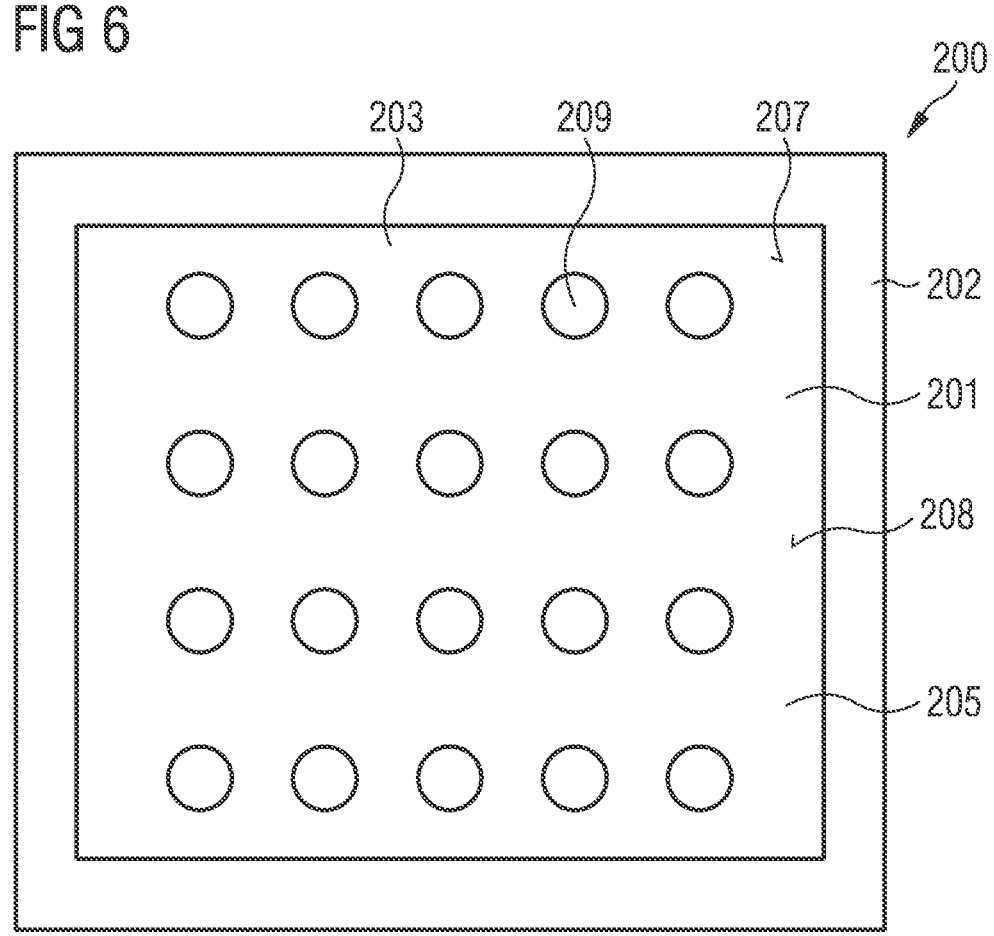

Showing in:

FIG. 1 a schematic representation of a laser component according to an exemplary embodiment, FIG. 2 a schematic exploded view of the laser component according to an exemplary embodiment, FIG. 3 a schematic representation of a sectional view of a housing cover according to an exemplary embodiment, FIG. 4 a schematic representation of a view of the housing cover of FIG. 3, FIG. 5 a schematic representation of a sectional view of a housing cover according to an exemplary embodiment, FIG. 6 a schematic representation of a view of the housing cover of FIG. 5, and FIGS. 7A to 7D a schematic representation of a manufacturing process for a housing cover according to an exemplary embodiment.

FIG. 1 shows a schematic representation of a laser component 100. The laser component 100 comprises a housing body 101 and a housing cover 200. The housing body 101 and the housing cover 200 together form a housing for a semiconductor laser diode 105 (FIG. 2), which is located inside the housing body 101.

The housing body 101 has one or more feed throughs 102. A contact pin 103 is arranged in each feed through. The contact pin 103 is used for making electrical contact with the semiconductor laser diode 105 from outside the housing. The feed through 102 with the contact pin 103 is hermetically sealed in particular.

The housing body 101 comprises a housing wall 104 that extends along a main radiation direction of the radiation emitted by the semiconductor laser diode 105 during operation. For example, the housing wall 105 surrounds an inner space in which the semiconductor laser diode 105 is located. For example, the semiconductor laser diode 105 is arranged on a bottom of the housing body 101. On a side of the housing wall 104 opposite the bottom, the housing cover 200 rests on the housing wall 104. For example, in this contact region, the housing wall 104 and the housing cover 200 are connected to each other, in particular hermetically sealed, so that a hermetically sealed inner space is formed. For example, the housing cover 200 is welded, soldered or otherwise connected to the housing body 101 in such a way that a sufficiently stable and tight connection is ensured. In particular, the housing body 101 is made of a metal, for example copper. The housing body 101 is made of a material that allows a good connection with the housing cover 200.

The housing cover 200 is attached to the housing body 101 on a beam exit side 106. In particular, the housing cover 200 is oriented parallel to the bottom surface of the housing body 101. Laser radiation emitted by the semiconductor laser diode 105 in emission direction 107 can exit the laser component 100 through the housing cover 200. For this purpose, the housing cover 200 is transparent or at least partially transparent for the laser radiation emitted by the semiconductor laser diode 105.

As can be seen in particular in FIG. 2, which schematically shows an exploded view of laser component 100, the housing cover 200 comprises a window 201 and a copper carrier 202. Inside the housing body 101 the semiconductor laser diode 105 is arranged, which in particular comprises a plurality of semiconductor laser chips. The semiconductor laser chips are electrically connected to the contact pins 103 (not shown explicitly).

The cover 200 and in particular the copper carrier 202 is placed on the housing wall 104 and is connected to the housing body 101 along the contact surface in a mechanically stable and preferably hermetically sealed manner, for example by means of a welding process. The welding process can be, for example, electric welding. It is thus possible that the inner space between the housing body 101 and the housing cover 200, in which the semiconductor laser diode 105 is located, is filled with a desired atmosphere, for example with dry air. Due to the hermetic sealing of the housing body 101 with the housing cover 200, the semiconductor laser diode 105 is particularly protected against harmful influences from outside the housing. Thus, accelerated aging and/or destruction of the semiconductor laser diode 105 can be reduced or prevented.

So that the radiation of the semiconductor laser diode 105 can penetrate through the copper carrier 202, the copper carrier 202 has one or more recesses 209. The recesses can be circular, as shown in FIG. 2. Other shapes for recesses 209 are also possible. It is also possible to adapt the position as well as the number of recesses 209 to the type and position of the semiconductor laser diode 105 as well as to the number of semiconductor chips.

The copper carrier 202 is extended in its main extension along a surface. The recesses 209 are arranged on this surface, which is aligned in particular parallel to the bottom of the housing body 101. In the edge area of the copper carrier 202 it is designed in such a way that it can be connected to the housing wall 101.

The window 201 is located on a side of the copper carrier 202 facing away from the housing body 101. The window 201 is permeable to radiation of the wavelength emitted by the semiconductor laser diode 105 during operation.

The window 201 and the copper carrier 202 are hermetically sealed together, as explained in more detail below.

FIG. 3 shows a schematic representation of the housing cover 200 according to an exemplary embodiment.

The copper carrier 202 comprises the recesses 209. At the side of the recesses, a copper oxide 204 is formed in an oxide region 203 on a surface 208 of the copper carrier 202 facing the window 201. The oxide region 203 runs in particular closed around the area of recesses 209, as can be seen in particular from the top view as shown in FIG. 4. Thus, an outwardly hermetically sealed connection between the window 201 and the copper carrier 202 is achieved.

For example, the copper oxide in the oxide region 203 is formed by heating the copper carrier 202 in an environment containing oxygen. Regions of the copper carrier 202 on which no copper oxide 204 is to be formed are ,for example, covered with a coating (not explicitly shown) during the formation of the copper oxide 204 in the oxide region 203.

In the exemplary embodiment shown in FIG. 3, window 201 is a glass window. The window 201 is provided with an aluminum oxide layer 212 on a surface 211 facing the copper carrier 202. The aluminum oxide layer 212 is applied to the window 201, particularly in a region 213. Further regions 214 outside region 213 are in particular free of aluminum oxide 212. In particular, the window 201 in region 213 is coated with aluminum oxide whose position corresponds to the position of the oxide region 203 and the copper oxide 204. The further region 214 corresponds to the region of the copper carrier 202, in which the recesses 209 are formed. In this region, the radiation of the semiconductor laser diode 105 passes through the housing cover 200 during operation.

Due to the coating of the window 201 with aluminum oxide 212, at least in some areas, it is possible to form a eutectic bond 205 between the window 201 and the copper carrier 202. The aluminum oxide layer 212 forms the eutectic bond 205 with the copper oxide 204, which provides a sufficiently stable and hermetically sealed connection between the window 201 and the copper carrier 202. To form the eutectic bond 205, the window 201 with the aluminum oxide layer 212 is placed on the copper oxide 204 in such a way that a common contact surface 216 is formed between the aluminum oxide layer 212 and the copper oxide 204. The aluminum oxide 212 and the copper oxide 204 touch each other and form the eutectic bond 205, for example, after heating and subsequent cooling.

For example, in the further region 214, the window 201, in particular the surface 211 of the window 201, and the copper carrier 202, in particular the surface 208 of the copper carrier 202, are spaced apart from one another so that a distance 215 is formed between the surface 211 of the window 201 and the surface 208 of the copper carrier 202. The eutectic bond 205 is formed in the region 213 and the oxide region 203. In the further region 214, no direct mechanical connection is formed between the copper carrier 202 and the window 201.

FIG. 5 shows a sectional view of the housing cover 200 according to another exemplary embodiment. The exemplary embodiment in FIG. 5 essentially corresponds to the exemplary embodiment in FIGS. 3 and 4. In contrast to the exemplary embodiment in FIGS. 3 and 4, the window 201 in the exemplary embodiment in FIG. 5 is a sapphire window 206. The window 201 is sapphire, at least on the surface 211 facing the copper carrier 202. It is also possible that the entire window 201 is made of sapphire and forms the sapphire window 206. The sapphire window can be connected directly to the copper carrier 202 by means of the eutectic bond 205 without an additional coating and especially without the additional aluminum oxide layer 212.

The copper oxide 204 is formed on the surface 208 of the copper carrier 202 in the oxide region 203. In particular, the copper oxide 204 is formed on the surface 204 in such a way that it is present in an entire contact surface 207. The contact surface 207 is the region where the sapphire window 206 comes into contact with the copper carrier 202. As can also be seen in FIG. 6, which shows a top view of the housing cover 200 of FIG. 5, the oxide region 203 is formed on the entire contact surface 207 between the sapphire window 206 and the copper carrier 202. Thus a flat eutectic bond 205 is formed between the sapphire window 206 and the surface 208 of the copper carrier 202. The eutectic bond 205 between the copper oxide 204 and the sapphire window 206 is directly possible, since the sapphire window 206 itself is a ceramic that has an aluminum oxide or is made of aluminum oxide.

FIG. 7 shows the housing cover 200 according to an exemplary embodiment in various steps during the production.

Window 201 is provided as shown in Figure A. In the exemplary embodiment shown, window 201 is a glass window coated with an aluminum oxide layer 212 in region 213. The further region 214 outside region 213 is free of the aluminum oxide layer 212.

According to other exemplary embodiments, the entire surface 211 of window 201 is coated with the aluminum oxide layer 212.

Figure 7A:
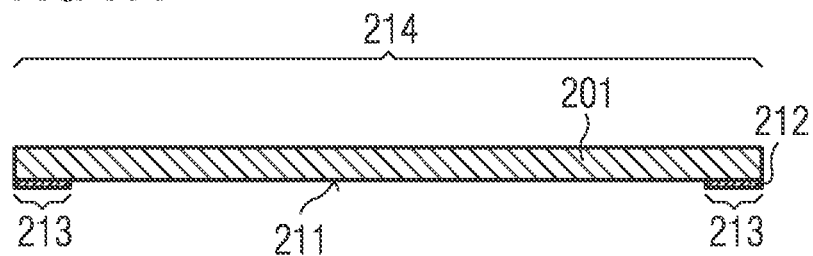
Figure 7B:
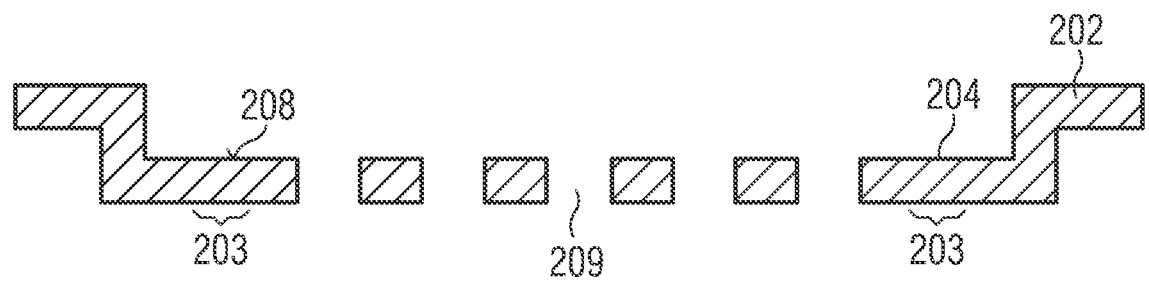

FIG. 7B shows the provision of copper carrier 202. The copper carrier 202 comprises the recesses 209 in a central region. Outside the central region, the oxide region 203 is provided, where the copper oxide 204 is formed.

Figure 7C:
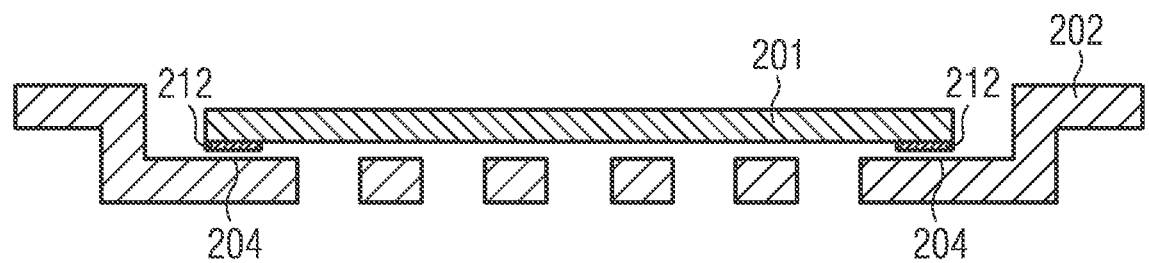
Figure 7D:
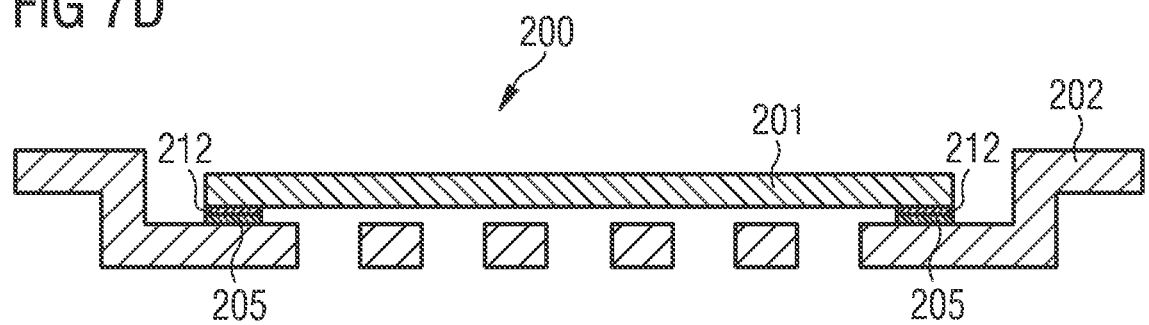

As shown in FIG. 7C, the window 201 is placed on the copper carrier 202. The window 201 is placed on the copper carrier 202 in such a way that the aluminum oxide layer 212 comes into contact with the copper oxide 204.

According to other exemplary embodiments, in which the window 201 is the sapphire window 206, the application of the aluminum oxide layer 212 is dispensed with. Consequently, in FIG. 7C, the window 201 is placed over the entire surface 208 of the copper carrier 202, with the exception of the recesses 207. The common contact surface 207 between the sapphire window 206 and the copper carrier 202 is thus formed along the entire surface 211 of the window 201 except for the recesses 209.

Subsequently, the copper carrier 202 and/or the aluminum oxide layer 212 and/or the sapphire window 206 are heated so that the eutectic bond 205 is formed between the copper oxide 204 and the aluminum oxide of the window 201. For this, not the entire aluminum oxide layer 212 is melted or the entire sapphire window 206 is melted respectively. Not all of the copper carrier 202 is melted either. A liquid eutectic of the copper oxide 204 is only formed in the contact area between the aluminum oxide 212 or the sapphire window 206 and the copper oxide 204. This wets the aluminum oxide or the sapphire and forms a copper aluminate. After cooling, the copper oxide 204 crystallizes and thus connects the copper carrier 202 with the aluminum oxide layer 212 and the sapphire window 206 respectively.

According to further exemplary embodiments, instead of the full-surface eutectic bond 205, the eutectic bond 205 is also formed in only one edge area of the sapphire window 206, corresponding to the exemplary embodiment in FIGS. 3 and 4. For this purpose, a coating is provided between the window 206 and the copper carrier 202, for example, so that the sapphire window 206 does not come into contact with the copper carrier 202 and, in particular, does not come into contact with copper oxide 204 in this area.

The eutectic bond 205 is thus possible both for the glass window 201 and the sapphire window 206, both in certain regions only and over the entire contact surface 207.

The housing cover 200 with the eutectic bond 205 between the window 201 and the copper carrier 202 enables a low-cost laser component 100. Instead of the conventionally used precious metals, less expensive materials can be used. The hermetic connection 205 is more stable than conventional soldered or welded connections. In addition, the preparatory steps that are conventionally required for welding or soldering can be dispensed with. The eutectic bond 205 also enables a large-area connection between the window 201 and the copper carrier 202.

The invention is not limited to the description based on the exemplary embodiments. Rather, the invention comprises each new feature as well as each combination of features, which in particular includes each combination of features in the claims, even if this feature or combination itself is not explicitly stated in the claims or exemplary embodiments.

LIST OF REFERENCE SIGNS

100 laser component
101 housing body
102 feed through
103 contact pin
104 housing wall
105 semiconductor laser diode
106 beam exit side
107 radiation direction
200 housing cover
201 window
202 copper carrier
203 oxide region
204 copper oxide
205 eutectic bond
206 sapphire window
207 common contact surface
208 surface of the copper carrier
209 recess
211 surface of the window
212 aluminum oxide layer
213 region
214 further region
215 distance
216 contact surface

The invention claimed is:

1. A method for producing a housing cover for a laser component, comprising:
providing an at least partially radiation-permeable window comprising an aluminum oxide,
providing a copper carrier for the window,
forming a copper oxide in an oxide region on the copper carrier,
arranging the window at the oxide region,
applying an aluminum oxide layer to a predetermined region of the window,
forming a eutectic bond between the window and the copper oxide in the oxide region, and thereby
fixing the window to the copper carrier.

2. The method according to claim 1, wherein the window has a sapphire window, the method further comprising:
placing the sapphire window directly on the oxide region so that the sapphire window and the copper oxide have a common contact surface,
forming the eutectic bond directly between the sapphire window and the copper oxide.

3. The method according to claim 2, comprising:
forming the copper oxide flat on a surface of the copper carrier,
forming the eutectic bond on the entire contact surface between the sapphire window and the surface of the copper carrier.

4. The method according to claim 2, comprising:
forming a coating on a surface of the sapphire window,
forming the eutectic bond on the surface of the sapphire window outside the coating.

5. The method according to claim 1, comprising forming of the eutectic bond between the aluminum oxide layer and the copper oxide, wherein the predetermined region of the window corresponds to the oxide region.

6. The method according to claim 5, comprising:
applying the aluminum oxide layer to the predetermined region of the window so that the window remains free of aluminum oxide outside the predetermined region,
fixing the window to the copper carrier so that the window and the copper carrier have a distance from each other outside the predetermined region.

7. The method according to claim 5, comprising:
forming the copper oxide flat on the surface of the copper carrier,
applying the aluminum oxide layer over an entire surface of the window,
forming the eutectic bond on the entire contact surface between the window of the surface of the copper carrier.

8. The method according to claim 5, comprising:
applying the aluminum oxide layer by means of vapor phase deposition.

9. A method for producing a laser component comprising:
providing a housing cover produced by a method according to claim 1, providing a housing body,
arranging a semiconductor laser diode in the housing body,
sealing of the housing body with the housing cover on a beam exit side of the laser component.

10. A housing cover for a laser component, comprising:
an at least partially radiation-permeable window comprising an aluminum oxide,
a copper carrier comprising a copper oxide in an oxide region,
a eutectic bond between the window and the copper oxide in the oxide region, which fixes the window to the copper carrier, wherein
an aluminum oxide layer is applied in a predetermined region of the window.

11. The housing cover according to claim 10, wherein
the window has a sapphire window, and
the eutectic bond is directly between the sapphire window and the copper oxide.

12. The housing cover according to claim 11, wherein
the sapphire window has a coating on a surface facing the copper carrier, and
the eutectic bond is formed outside the coating.

13. The housing cover according to claim 10, wherein
the predetermined region of the window corresponds to the oxide region, and
the eutectic bond is between the aluminum oxide layer and the copper oxide.

14. The housing cover according to claim 10, wherein the window outside the eutectic bond has a distance from the copper carrier.

15. A laser component, comprising:
a housing cover according to claim 10,
a housing body,
a semiconductor laser diode arranged in the housing body, wherein the housing body is sealed with the housing cover at a beam exit side of the laser component.

* * * * *